(12) United States Patent
Chu et al.

(10) Patent No.: US 6,858,533 B2
(45) Date of Patent: Feb. 22, 2005

(54) SEMICONDUCTOR DEVICE HAVING AN ETCH STOPPER FORMED OF A SIN LAYER BY LOW TEMPERATURE ALD AND METHOD OF FABRICATING THE SAME

(75) Inventors: Kang-soo Chu, Suwon (KR); J o-won Lee, Suwon (KR); Jae-eun Park, Yongin (KR); Jong-ho Yang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/612,028

(22) Filed: Jul. 2, 2003

(65) Prior Publication Data
US 2004/0046189 A1 Mar. 11, 2004

(30) Foreign Application Priority Data
Sep. 11, 2002 (KR) .................................. 10-2002-0055005

(51) Int. Cl.[7] ......................................... H01L 21/4763
(52) U.S. Cl. ........................ 438/637; 257/387; 257/586
(58) Field of Search ................................ 438/637, 387, 438/257, 586

(56) References Cited

U.S. PATENT DOCUMENTS

2003/0073308 A1 * 4/2003 Mercaldi .................... 438/680
2003/0109107 A1 * 6/2003 Hsieh et al. ................ 438/303

FOREIGN PATENT DOCUMENTS

KR         P2002-0030569         4/2002         .......... H01L/21/20

* cited by examiner

Primary Examiner—Long Pham
(74) Attorney, Agent, or Firm—Mills & Onello, LLP

(57) ABSTRACT

Provided are a semiconductor device having an etch stopper formed of a nitride film by low temperature atomic layer deposition which can prevent damage to a semiconductor substrate and a method for fabricating the semiconductor device. Damage to the semiconductor substrate under the etch stopper composed of a second nitride film can be prevented by forming a first nitride film using high temperature LPCVD on the semiconductor substrate, forming the etch stopper including the second nitride film by low temperature ALD on the first nitride film, and removing the second nitride film by dry etching, thus taking advantage of the different etch selectivities of the first nitride film and the second nitride film.

10 Claims, 3 Drawing Sheets

SEMICONDUCTOR DEVICE HAVING AN ETCH STOPPER FORMED OF A SIN LAYER BY LOW TEMPERATURE ALD AND METHOD OF FABRICATING THE SAME

BACKGROUND OF THE INVENTION

This application claims the priority of Korean Patent Application No. 2002-55005, filed on Sep. 11, 2002, in the Korean Intellectual Property Office, the contents of which are incorporated herein in their entirety by reference.

1. Field of the Invention

The present invention relates to a semiconductor device and a method for fabricating the semiconductor device, and more particularly, to a semiconductor device having an etch stopper formed of a silicon nitride (SiN) layer by low-temperature atomic layer deposition (ALD) in a self-aligned contact (SAC) process and a method for fabricating the semiconductor device.

2. Description of the Related Art

As a finer pattern and a thinner film are required in a process of fabricating semiconductor devices, atomic layer deposition (ALD) technology beneficial for the finer pattern and the thinner film is more widely applied to DRAM devices. In particular, ALD is useful for accurately controlling the thickness of a film and thus is used to form capacitor dielectric films, diffusion barriers, gate dielectric layers, and the like.

As semiconductor devices become highly integrated, the space between gates becomes smaller, and thus a self-aligned contact (SAC) process having a design rule for the space of about 0.2 μm has been generally used. The SAC process uses a gate pattern as an etch buffer so as to cause a short between a contact plug and the gate pattern due to a misalignment when a contact hole is formed in a source or a drain between gates. As a technique using the SAC process is introduced into a method of fabricating the semiconductor device, a process related to the SAC process is changed accordingly.

FIG. 1 is a sectional view illustrating the SAC process according to the conventional art after a second etching is performed, and FIG. 2 is a enlarged view of area A of FIG. 1.

Referring to FIG. 1, a gate pattern 20 is formed on a semiconductor substrate 10, and an etch stopper 30 is deposited on the gate pattern 20. Then, an interlayer insulating film 40 is formed on the gate pattern 20 and the semiconductor substrate 10, and the interlayer insulating film 40 is planarized. A photoresist pattern 50 is formed on the interlayer insulating film 40, and a self-aligned contact hole 60 is formed by dry etching, exposing a source region and a drain region of the gate pattern 20.

In the dry etching for forming the self-aligned contact hole 60, an oxide film or a nitride film having a high etching selectivity with the interlayer insulating film 40 formed of oxide film and formed by low pressure chemical vapor deposition (LPCVD) is used as an insulating pattern 26 on the upper side of the gate and a gate spacer 28 so as to prevent a gate electrode pattern 22 and a silicide pattern 24 of the gate pattern 20 from being etched.

In addition, when the self-aligned contact hole is dry etched, the nitride film formed by LPCVD is used as the etch stopper 30 so as to prevent damage to the semiconductor substrate 10 from etching. The etch stopper 30 is a thin film having a thickness of 100–200 Å and is removed by a second dry etch of which the etching conditions are different from the etching conditions of the dry etch for forming the self-aligned contact hole, after dry etching the interlayer insulating film 40 to form the self-aligned contact hole.

However, in a second dry etching for the thin etch stopper 30 of the conventional self-aligned contact process, the semiconductor substrate 10 is also etched, and thus a recess in or damage to the semiconductor substrate 10 results, as shown in FIG. 2. This is because the film to be etched is very thin, and a constant etching speed for the whole wafer is not yet possible. Further, the thickness of the nitride film cannot be controlled to be constant. In addition, since there are differences among equipment used for mass production, it is difficult to consistently etch thin films, a fact which causes further damage to semiconductor substrates.

Damage to the semiconductor substrate 10 or a recess therein can cause AC parameter defects such as $T_{RDL}$ (last data in to row precharge) in the DRAM device chip at the center of the wafer which has been etched less while degrading the refresh characteristics at the edge of the wafer which has been etched more. Thus, reliability and yield of the semiconductor device are reduced.

SUMMARY OF THE INVENTION

The present invention provides a semiconductor device having an etch stopper formed of a nitride film by low temperature atomic layer deposition (ALD) so as to prevent damage to a semiconductor substrate and prevent a recess from forming therein.

The present invention also provides a method for fabricating a semiconductor device having an etch stopper formed of a nitride film by low temperature ALD.

According to an aspect of the present invention, there is provided a semiconductor device having an etch stopper formed of a nitride film using low temperature atomic layer deposition, the semiconductor device comprising a gate pattern which is formed on the semiconductor device and composed of a top layer formed of a first nitride film using low pressure chemical vapor deposition and a gate spacer. An etch stopper covers the semiconductor substrate and the gate pattern and includes a second nitride film formed using low temperature atomic layer deposition. An interlayer insulating film is formed on the etch stopper.

According to a preferred embodiment of the present invention, it is preferable that the etch stopper be formed at a temperature of 100 to 500° C. and the thickness of the etch stopper be within 100 to 700 Å.

Preferably, the gate pattern of the semiconductor device comprises a gate electrode which is formed on the semiconductor substrate and includes polysilicon and a silicide layer which is formed on the gate electrode. The top layer of the gate pattern is formed on the silicide layer and includes the first nitride film formed using low pressure chemical vapor deposition. The gate spacer is formed on the sidewalls of the gate electrode, the silicide layer, and the top layer and includes the first nitride film formed using low pressure chemical vapor deposition.

In addition, the interlayer insulating film can be a single film formed of an oxide film including one of $SiO_2$, BPSG, HDP oxide, and Fox, and the interlayer insulating film can be a multi-layer film including films composed of an oxide film including one of $SiO_2$, BPSG, HDP oxide, Fox.

According to another aspect, the present invention is directed to a method for fabricating a semiconductor device having an etch stopper formed of a nitride film using low temperature atomic layer deposition. A gate pattern is formed on a semiconductor substrate. The gate pattern includes a first nitride film formed using low pressure chemical vapor deposition for a top layer and sidewalls. An etch stopper is formed covering the gate pattern and the semiconductor substrate to a predetermined thickness and includes a second nitride film formed using low temperature atomic layer deposition. An interlayer insulating film is deposited on the semiconductor substrate where the etch stopper is formed. A self-aligned contact hole is formed by dry etching the interlayer insulating film by using the gate pattern as a mask. The etch stopper which is exposed to the self-aligned contact hole by wet etching is removed.

According to a preferred embodiment of the present invention, forming the gate pattern comprises depositing a gate electrode, a silicide layer, and a top layer, which includes the first nitride film formed using low pressure chemical vapor deposition, on the semiconductor substrate; etching the gate electrode, the silicide layer, and the top layer; and forming the gate spacer, which is composed of the first nitride film formed using low pressure chemical vapor deposition, on the sidewalls of the gate electrode, the silicide layer, and the top layer.

The second nitride film by the atomic layer deposition is formed at a temperature of 100 to 500° C., and the thickness of the second nitride film is within 100 to 700 Å.

Preferably, as a reaction gas for forming the etch stopper, one of $SiH_4$, $SiCl_2H_2$, and $SiCl_4$ is used as a silicon source, and one of $N_2$, $NH_3$, and $N_2O$ is used as a nitrogen source.

In addition, the interlayer insulating film is a single layer film formed of an oxide film including $SiO_2$, BPSG, HDP oxide, Fox, and the interlayer insulating film is a multi-layer film including films composed of an oxide film including $SiO_2$, BPSG, HDP oxide, Fox.

According to another preferred embodiment of the present invention, the dry etching for forming the self-aligned contact hole continues until the etch stopper is exposed. A hydrofluoric acid solution as an etching solution is used in the wet etching for removing the etch stopper. The wet etching for removing the etch stopper employs a SC1 cleaning method which is developed by RCA Inc.

According to the present invention, a recess occurring in and damage to the semiconductor substrate can be prevented by using the first nitride film as an etch stopper. The first nitride film is formed of the same material as a top film and a gate spacer and the second nitride film, having a high etch selectivity and which is formed by low temperature ALD.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

The present invention now will be described more fully with reference to the accompanying drawings, in which preferred embodiments of the invention are shown. This invention may, however, be embodied in many different forms and should not be construed as being limited to the embodiments set forth herein. Various embodiments may be implemented without departing from the spirit and the essential characteristics of the invention as defined by the appended claims. For example, in a preferred embodiment of the present invention, an etch stopper formed of a second nitride film by low temperature atomic layer deposition (ALD) (i.e., under 500° C.) is applied or used on a gate pattern in a SAC process. The second nitride film can also be used as an etch stopper in other processes. Therefore, the following examples are for illustrative purposes and are not intended to limit the scope of the invention.

Figure 5:
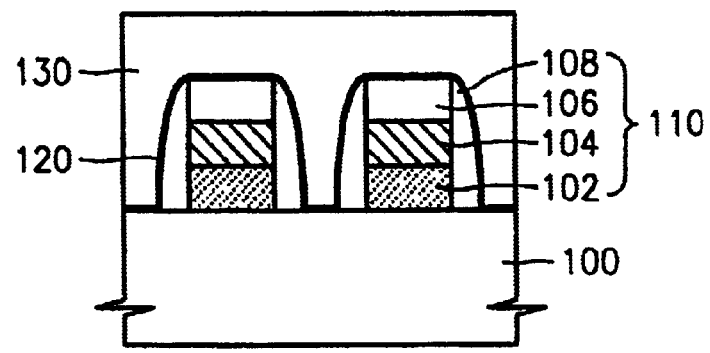

Referring to FIG. 5, a semiconductor device having an etch stopper formed of a nitride film by low temperature ALD will be described.

The semiconductor device having the etch stopper formed of the nitride film by low temperature ALD, according to the present invention, includes a semiconductor substrate 100 formed on a pad oxide film (not shown), a gate pattern 110 formed on the semiconductor substrate 100, an etch stopper 120 which covers the semiconductor substrate 100 and the gate pattern 110 in a blanket manner, i.e., conformally, and is a second nitride film formed by ALD, and ain interlayer insulating film 130 formed on the etch stopper 120. The gate pattern 110 includes a top layer 106 formed of a first nitride film by low pressure chemical vapor deposition (LPCVD) and a gate spacer 108.

Figure 6:
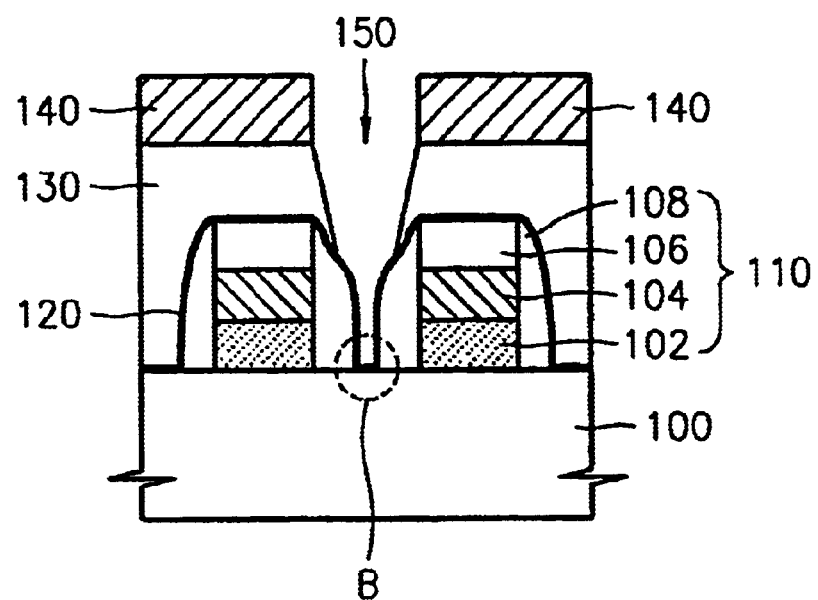

During dry etching to form a self-aligned contact hole 150 of FIG. 6 by etching the interlayer insulating film 130 formed of an oxide film, the etch stopper 120 functions well because it has an etch selectivity 1–1.3 times higher than the etch selectivity of the top layer 106 and the gate spacer 108, which are composed of the first nitride film, of the gate pattern 110. Here, the top layer 106 and the gate spacer 108 are formed by LPCVD at a high temperature, i.e., over 600° C.

In addition, in a second wet etch process to remove the etch stopper 120, the etch stopper 120 has an etch rate 20 times higher than the etch rate of the top layer 106 and the gate spacer 108, which are composed of the first nitride film, of the gate pattern 110 and has a low density. Thus, the etch stopper 120 can be removed without causing a recess in the semiconductor substrate 100 or damage thereto.

Therefore, the etch stopper 120 formed of the second nitride film by the low temperature ALD according to the present invention has a high etch selectivity to the oxide film, which composes the interlayer insulating film 130, in dry etching and has a high etch selectivity to the first nitride film by the high temperature LPCVD in wet etching.

Next, a SAC process of the semiconductor device having the etch stopper formed of the nitride film by low temperature ALD, according to the present invention, will be described with reference to FIGS. 3 through 7.

Figure 1:
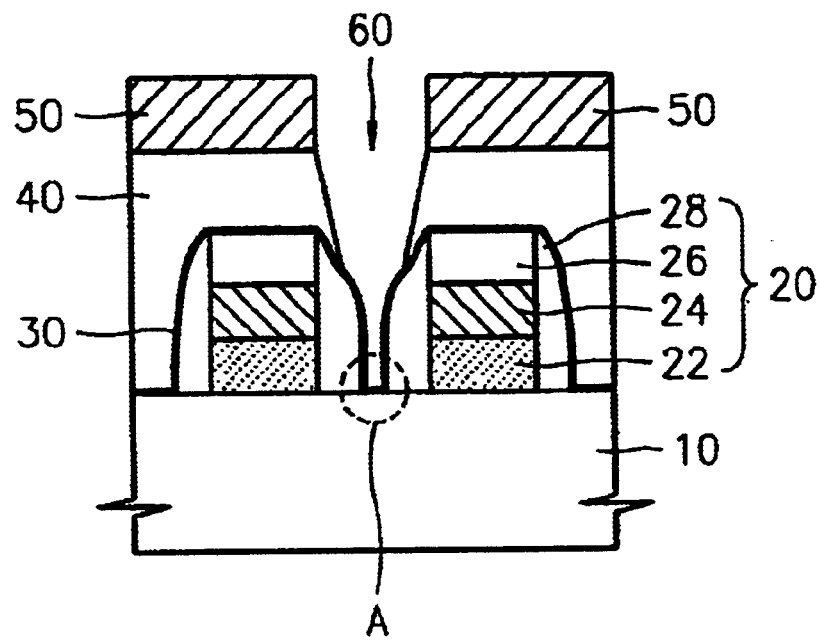
FIG. 1 is a sectional view illustrating a self-aligned contact (SAC) process according to the conventional art.
Figure 2:
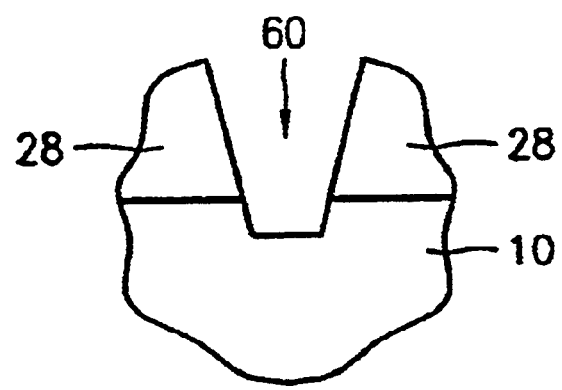
FIG. 2 is an enlarged view of area A of FIG. 1.
Figure 3:
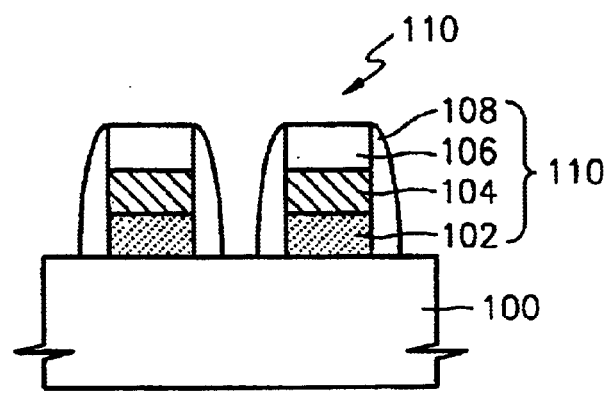
FIGS. 3 through 7 are sectional views illustrating a SAC process of a semiconductor device using a nitride film, formed by low temperature ALD, as an etch stopper, in accordance with the invention.

Referring to FIG. 3, the gate pattern 110 is formed on the semiconductor substrate 100 where the pad oxide film is formed. Here, the gate pattern 110 is formed by depositing a gate oxide film (not shown), a polysilicon film for a gate electrode 102, a silicide layer 104, and a first nitride film for the top layer pattern 106 on the semiconductor substrate 100 and then forming the gate spacer 108 composed of the first nitride film on the sidewalls of the resultant structure. The top layer pattern 106 and the gate spacer 108 of the gate pattern 110 are composed of the first nitride film, which is formed by high temperature LPCVD, i.e., over 600° C.

Figure 4:
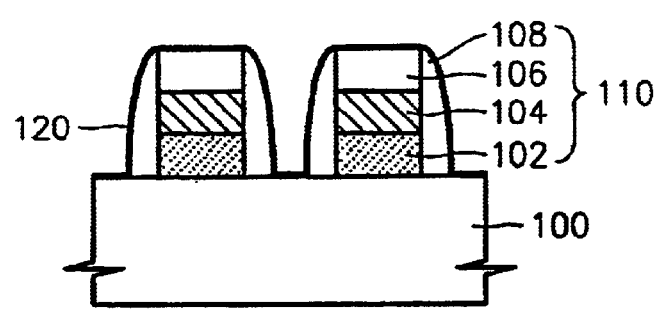

Referring to FIG. 4, the etch stopper 120 is formed to cover the gate pattern 110 and the whole semiconductor substrate 100 in a blanket manner. That is, the etch stopper 120 is formed to conformally cover the gate pattern 110 and the whole semiconductor substrate 100. The etch stopper 120 is composed of the second nitride film formed by low temperature ALD (i.e., 100–500° C.) and the appropriate thickness of the etch stopper 120 is 100–700 Å. The ALD for forming the second nitride film, i.e., the etch stopper 120, uses one of $SiH_4$, $SiCl_2H_2$, or $SiCl_4$ as a silicon source and one of $N_2$, $NH_3$, or $N_2O$ as a nitrogen source. The second nitride film can be formed at a lower temperature than the first nitride film and has a low density. Consequently, the second nitride film functions well as the etch stopper 120 when patterning the interlayer insulating film 130. In addition, the second nitride film, i.e., the etch stopper 120, is easily removed without causing a recess or damage to the lower film, e.g., the semiconductor substrate 100, during the wet etching.

Referring to FIG. 5, the interlayer insulating film 130 is formed on the semiconductor substrate 100 where the etch stopper 120 is formed, to planarize the semiconductor substrate 100. The interlayer insulating film 130 is formed of a single layer film composed of an oxide film including $SiO_2$, BPSG, HDP oxide, or Fox or of a multi-layer film including a single layer film composed of an oxide film including one of $SiO_2$, BPSG, HDP oxide, Fox. Here, a CMP (chemical mechanical polishing) process or a planarizing process such as reflow can be applied to the interlayer insulating film 130, if necessary.

Referring to FIG. 6, a photoresist pattern 140 is formed on the semiconductor substrate 100 where the interlayer insulating film 130 is formed and the interlayer insulating film 130 is dry etched, thereby forming a self-aligned contact hole 150. Here, the etch stopper 120 composed of the second nitride film prevents the silicide layer 104 or the gate electrode 102 from being etched in the dry etching for forming the self-aligned contact hole 150 and prevents damage to the semiconductor substrate 100.

Figure 7:
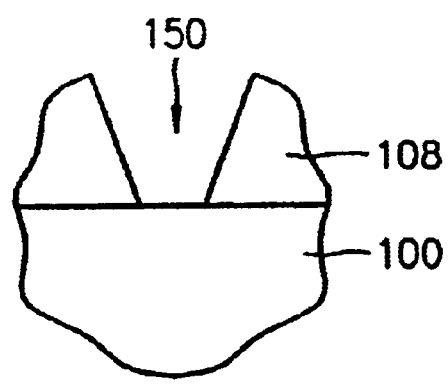

FIG. 7 is an enlarged view of area B of FIG. 6 and shows the result of applying the dry etching to B.

Referring to FIG. 7, in contrast to the conventional art in which the etch stopper 120 is removed by dry etching, the composition of the etch stopper 120 is changed so that the etch stopper 120 is composed of the second nitride film formed by low temperature ALD, and the changed etch stopper 120 is removed by wet etching in the present invention. Here, a hydrofluoric acid (HF) solution may be used as an etching solution. Alternatively, SC1 (standard cleaning 1), which was developed by RCA Inc., can be applied in the wet etching.

SC1 includes a step of cleaning for 10 minutes with a cleaning solution at a temperature of 80° C., and composed of $NH_4OH$, $H_2O_2$ and $H_2O$ in a ratio of 1:1:5, rinsing with deionised water, cleaning by dipping in 1 percent hydrofluoric acid (HF) solution, rinsing with deionised water, cleaning for 10 minutes with a cleaning solution at a temperature of 80° C. and, composed of HCl, $H_2O_2$, and $H_2O$ in a ratio of 1:1:6, rinsing with deionised water, and spin drying.

As described above, the first nitride film, which constitutes the top layer and the gate spacer of the gate pattern in the SAC process, and the second nitride film having a high selectivity in the wet etching, e.g., a film formed by low temperature ALD, are used as the etch stopper, thus a recess in the semiconductor substrate and damage thereto can be prevented.

While this invention has been particularly shown and described with reference to preferred embodiments thereof, it will be understood by those skilled in the art that various changes in form and details may be made therein without departing from the spirit and scope of the invention as defined by the appended claims and equivalents.

What is claimed is:

1. A method for fabricating a semiconductor device having an etch stopper formed of a nitride film using low temperature atomic layer deposition, the method comprising:

forming a gate pattern on a semiconductor substrate in which the gate pattern includes a first nitride film formed using low pressure chemical vapor deposition for a top layer and sidewalls;

forming an etch stopper which covers the gate pattern and the semiconductor substrate to a predetermined thickness and comprises a second nitride film formed using low temperature atomic layer deposition;

depositing an interlayer insulating film on the semiconductor substrate where the etch stopper is formed;

forming a self-aligned contact hole by dry etching the interlayer insulating film using the gate pattern as a mask; and removing the etch stopper which is exposed to the self-aligned contact hole by wet etching.

2. The method of claim 1, wherein forming the gate pattern comprises:

depositing a gate electrode, a suicide layer, and a top layer, which comprises the first nitride film formed using low pressure chemical vapor deposition, on the semiconductor substrate;

etching the gate electrode, the suicide layer, and the top layer; and forming the gate spacer, which comprises the first nitride film formed using low pressure chemical vapor deposition, on the sidewalls of the gate electrode, the silicide layer, and the top layer.

3. The method of claim 1, wherein the second nitride film formed by atomic layer deposition is formed at a temperature of 100 to 500° C.

4. The method of claim 1, wherein as a reaction gas for forming the etch stopper, one of $SiH_4$, $SiCl_2H_2$, and $SiCl_4$ is used as a silicon source, and one of $N_2$, $NH_3$, and $N_2O$ is used as a nitrogen source.

5. The method of claim 1, wherein the thickness of the second nitride film is within 100 to 700 Å.

6. The method of claim 1, wherein the interlayer insulating film is a single layer film formed of an oxide film including $SiO_2$, BPSG, HDP oxide, Fox.

7. The method of claim 1, wherein the interlayer insulating film is a multi-layer film including films comprising an oxide film including $SiO_2$, BPSG, HDP oxide, Fox.

8. The method of claim 1, wherein the dry etching for forming the self-aligned contact hole continues until the etch stopper is exposed.

9. The method of claim 1, wherein a hydrofluoric acid solution as an etching solution is used in the wet etching for removing the etch stopper.

10. The method of claim 1, wherein the wet etching for removing the etch stopper employs a SC1 cleaning method.

* * * * *

UNITED STATES PATENT AND TRADEMARK OFFICE
CERTIFICATE OF CORRECTION

PATENT NO. : 6,858,533 B2
DATED : February 22, 2005
INVENTOR(S) : Kang-soo Chu et al.

It is certified that error appears in the above-identified patent and that said Letters Patent is hereby corrected as shown below:

Column 6,
Lines 29 and 33, delete "suicide" and insert -- silicide --.

Signed and Sealed this

Twenty-fourth Day of May, 2005

JON W. DUDAS
*Director of the United States Patent and Trademark Office*